US012772443B2

(12) United States Patent
Kim

(10) Patent No.: US 12,772,443 B2
(45) Date of Patent: Oct. 20, 2026

(54) SEMICONDUCTOR DEVICE AND METHOD FOR FABRICATING THE SAME

(71) Applicant: SK hynix Inc., Gyeonggi-do (KR)

(72) Inventor: Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 571 days.

(21) Appl. No.: 18/193,634

(22) Filed: Mar. 31, 2023

(65) Prior Publication Data

US 2024/0049482 A1 Feb. 8, 2024

(30) Foreign Application Priority Data

Aug. 5, 2022 (KR) ........................ 10-2022-0097789

(51) Int. Cl.

| | |
|---|---|
| ***H10B 12/00*** | (2023.01) |
| ***H10B 80/00*** | (2023.01) |
| *H10W 90/00* | (2026.01) |

(52) U.S. Cl.

CPC ............. *H10B 12/50* (2023.02); *H10B 12/03* (2023.02); *H10B 12/482* (2023.02); *H10B 12/488* (2023.02); *H10B 80/00* (2023.02); *H10W 90/792* (2026.01)

(58) Field of Classification Search

CPC ........... H01L 2224/08145; H01L 24/05; H01L 24/08; H01L 2924/1436; H10B 12/03; H10B 12/033; H10B 12/05; H10B 12/09; H10B 12/30; H10B 12/31; H10B 12/48; H10B 12/482; H10B 12/488; H10B 12/50; H10B 80/00; H10D 1/714; H10W 72/90; H10W 90/792

See application file for complete search history.

(56) References Cited

U.S. PATENT DOCUMENTS

2018/0323199 A1 11/2018 Roberts et al.
2021/0183862 A1 6/2021 Son et al.
2024/0023320 A1* 1/2024 Liu ........................ H10B 12/05

FOREIGN PATENT DOCUMENTS

KR 10-2021-0007737 A 1/2021
KR 10-2021-0012710 A 2/2021

OTHER PUBLICATIONS

Office Action for Korean Patent Application No. 10-2022-0097789 issued by the Korean Patent Office on Jan. 26, 2026.

* cited by examiner

*Primary Examiner* — Britt Hanley
*Assistant Examiner* — Kevin Quinto
(74) *Attorney, Agent, or Firm* — IP&T GROUP LLP

(57) ABSTRACT

A semiconductor device includes: a memory cell array including a vertical conductive line, a horizontal conductive line, and a data storage element; a peripheral circuit portion disposed at a lower-level than the memory cell array; a first bonding pad structure suitable for electrically connecting the vertical conductive line of the memory cell array and the peripheral circuit portion; and an upper pad disposed at a higher level than the memory cell array and coupled to the data storage element.

14 Claims, 8 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2022-0097789, filed on Aug. 5, 2022, which is incorporated herein by reference in its entirety.

BACKGROUND

1. Field

Various embodiments of the present invention relate to a semiconductor device and, more particularly, to a semiconductor device of a three-dimensional structure, and a method for fabricating the same.

2. Description of the Related Art

Recently, in order to cope with the trend of continuously larger capacity and greater miniaturization of memory devices, development of three-dimensional (3D) memory devices in which a plurality of memory cells are stacked over a substrate has been proposed.

SUMMARY

Embodiments of the present invention are directed to a semiconductor device including highly integrated memory cells, and a method for fabricating the semiconductor device.

In accordance with an embodiment of the present invention, a semiconductor device includes: a memory cell array including a vertical conductive line, a horizontal conductive line, and a data storage element; a peripheral circuit portion disposed at a lower-level than the memory cell array; a first bonding pad structure suitable for electrically connecting the vertical conductive line of the memory cell array and the peripheral circuit portion; and an upper pad disposed at a higher level than the memory cell array and coupled to the data storage element.

In accordance with another embodiment of the present invention, a semiconductor device includes: a memory cell array including a vertical conductive line, a horizontal conductive line, and a data storage element; a peripheral circuit portion disposed at a lower-level than the memory cell array; a first bonding pad structure suitable for electrically connecting the data storage element of the memory cell array and the peripheral circuit portion; and an upper pad disposed at a higher level than the memory cell array and coupled to the vertical conductive line.

In accordance with another embodiment of the present invention, a method for fabricating a semiconductor device includes: forming a memory cell array including a vertical conductive line, a horizontal conductive line, and a data storage element over a first substrate; forming a lower pad over the vertical conductive line; forming a peripheral circuit portion over a second substrate; forming a first bonding pad over the peripheral circuit portion; forming a second bonding pad coupled to the lower pad by inverting the first substrate such that the lower pad is disposed at a lowermost level; bonding the first bonding pad and the second bonding pad to each other; removing the first substrate such that a portion of the vertical conductive line and a portion of the data storage element are exposed; and forming an upper pad coupled to the exposed portion of the data storage element. After the forming of the upper pad, the lower pad is disposed at a lower-level than the memory cell array, and the upper pad is disposed at a higher level than the memory cell array. The bonding of the first bonding pad and the second bonding pad includes metal-to-metal bonding or hybrid bonding. The method further includes forming a multi-level interconnection between the peripheral circuit portion and the first bonding pad. The vertical conductive line includes a bit line, and the horizontal conductive line includes a word line. The data storage element includes a storage node, a dielectric layer, and a plate node, and the upper pad is coupled to the plate node.

In accordance with another embodiment of the present invention, a method for fabricating a semiconductor device includes: forming a memory cell array including a vertical conductive line, a horizontal conductive line, and a data storage element over a first substrate; forming a lower pad coupled to the data storage element; forming a peripheral circuit portion over a second substrate; forming a first bonding pad over the peripheral circuit portion; forming a second bonding pad coupled to the lower pad by inverting the first substrate such that the lower pad is disposed at a lowermost level; bonding the first bonding pad and the second bonding pad to each other; removing the first substrate such that a portion of the vertical conductive line and a portion of the data storage element are exposed; and forming an upper pad coupled to the exposed portion of the vertical conductive line.

These and other features and advantages of the present invention will become apparent to those skilled in the art from the following figures and detailed description.

DETAILED DESCRIPTION

Figure 1:
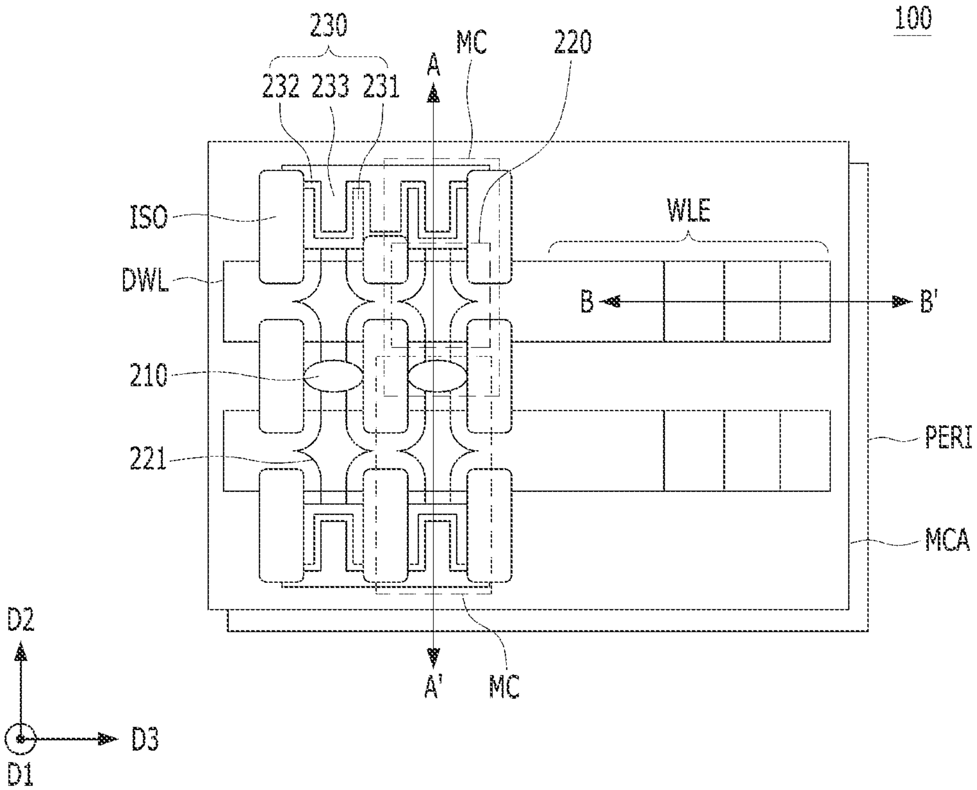
FIG. 1 is a simplified schematic plan view illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to the following embodiments of the present invention, it is possible to increase the memory cell density and reduce the parasitic capacitance of vertically stacked memory cells.

Figure 2:
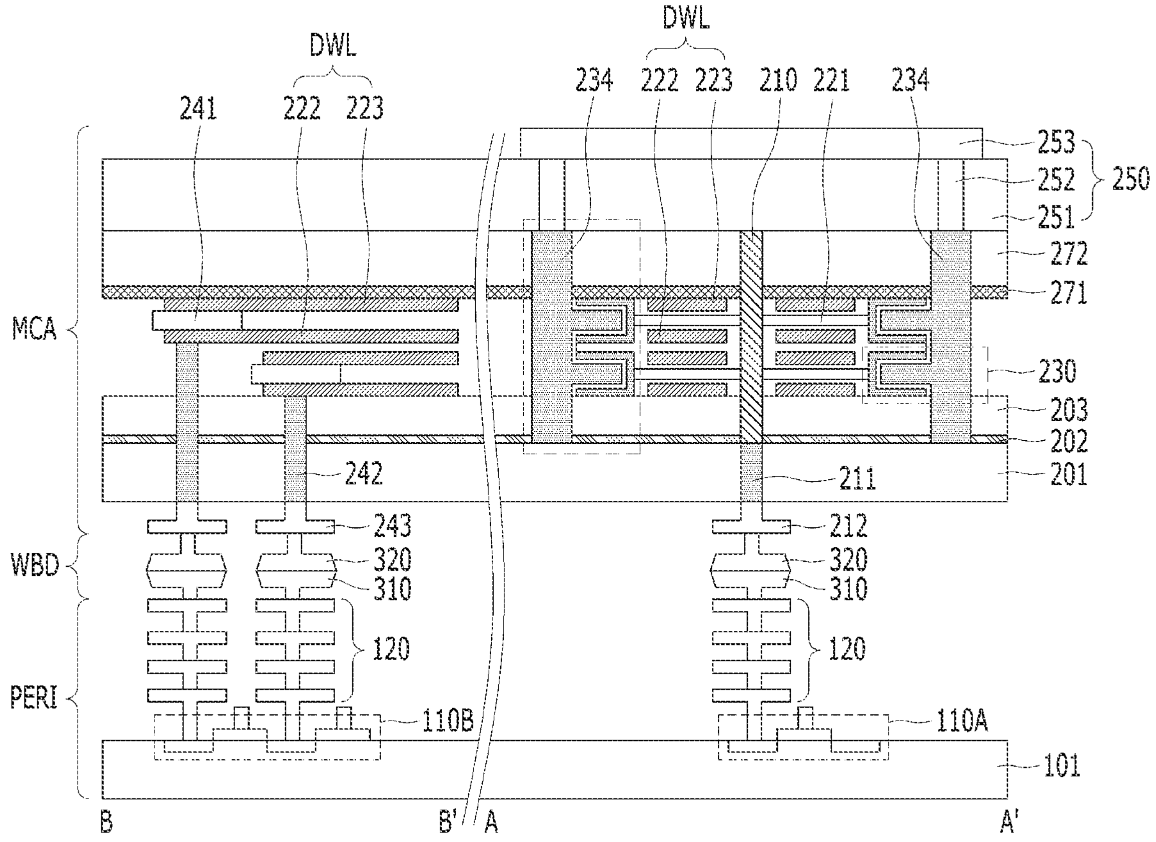
FIG. 2 is a cross-sectional view taken along lines A-A' and B-B' of FIG. 1.
Figure 3:
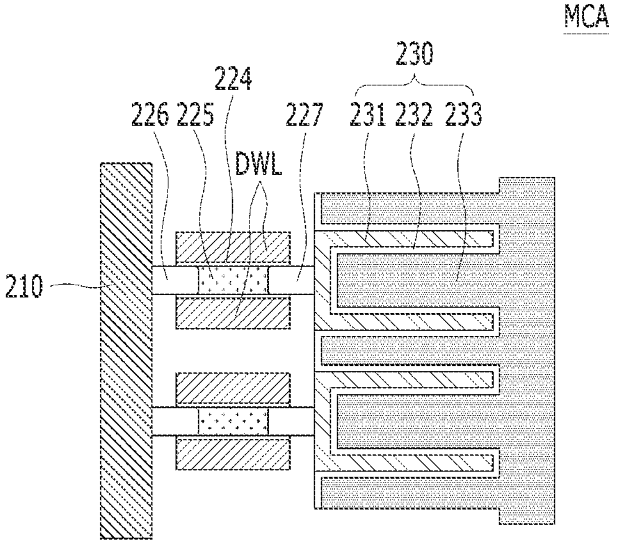
FIG. 3 is a simplified schematic cross-sectional view illustrating a memory cell array.

FIG. 1 is a simplified schematic plan view illustrating a semiconductor device in accordance with an embodiment of the present invention. FIG. 2 is a cross-sectional view taken along lines A-A' and B-B' of FIG. 1. FIG. 3 is a simplified schematic cross-sectional view illustrating a memory cell array.

Referring now to FIGS. 1 to 3, the semiconductor device 100 in accordance with an embodiment of the present invention may include a first level, a second level, and a bonding structure WBD between the first level and the second level. The second level may be disposed higher than the first level. The second level may include a plurality of memory cells, and the first level may include a memory cell control circuit.

According to the embodiment of the present invention, the first level may include a peripheral circuit portion PERI, and the second level may include a memory cell array MCA. The second level may be bonded to the first level by the bonding structure WBD. The bonding structure WBD may include metal-to-metal bonding. The bonding structure WBD may include hybrid bonding. Metal-to-metal bonding may include, for example, direct bonding of metallic bonding pads. Hybrid bonding, for example, may include a combination of metal-to-metal bonding and dielectric bonding. The dielectric bonding may include, for example oxide-to-oxide bonding. The memory cell array MCA of the second level may include Dynamic Random Access Memory (DRAM), NAND, Ferroelectric RAM (FeRAM), Phase-Change RAM (PCRAM), Resistive RAM (RRAM), Magnetic RAM (MRAM), or Spin Transfer Torque RAM (STTRAM).

The semiconductor device 100 may further include a third level disposed higher than the second level. The third level may include an upper pad 253. The upper pad 253 may be coupled to the memory cell array MCA of the second level. The upper pad 253 may include a single-layer metal.

As described above, the semiconductor device 100 may include a first level including a peripheral circuit portion PERI and a second level including a memory cell array MCA, and the peripheral circuit portion PERI and the memory cell array MCA may be coupled to each other by the bonding structure WBD.

According to the embodiment of the present invention, the memory cell array MCA may include a memory cell array of a DRAM. The memory cell array MCA may include a vertical conductive line 210, a horizontal conductive line DWL, and a data storage element 230. The peripheral circuit portion PERI may be disposed at a lower-level than the memory cell array MCA. The bonding structure WBD may include first and second bonding pads 310 and 320 for electrically connecting the memory cell array MCA with the peripheral circuit portion PERI. The bonding structure WBD may include a first bonding pad structure and a second bonding pad structure. The first bonding pad structure may include first and second bonding pads 310 and 320 for electrically connecting the vertical conductive line 210 of the memory cell array MCA with the peripheral circuit portion PERI. The second bonding pad structure may include first and second bonding pads 310 and 320 for electrically connecting the horizontal conductive line DWL and the data storage element 230 of the memory cell array MCA with the peripheral circuit portion PERI.

The upper pad 253 may be disposed at a higher level than the memory cell array MCA, and the upper pad 253 may be coupled to the data storage element 230. The upper pad 253 are also referred to as a plate pad or a single-layer interconnection.

The data storage element 230 may include a memory element. For example, the data storage element 230 may include a capacitor. Hereinafter, the data storage element 230 will be simply referred to as a 'capacitor 230'. The vertical conductive line 210 and the horizontal conductive line DWL will be simply referred to as a bit line 210 and a word line DWL, respectively.

The semiconductor device 100 may include a peripheral circuit portion PERI and a memory cell array MCA. The memory cell array MCA may be disposed over the peripheral circuit portion PERI. The memory cell array MCA and the peripheral circuit portion PERI may be coupled by wafer bonding using the bonding structure WBD.

The memory cell array MCA may include a plurality of memory cells MC. The memory cell array MCA may have a mirror-type structure sharing the bit line 210. Each memory cell MC may include a bit line 210, a capacitor 230 and a transistor 220 including a horizontal layer 221 and a word line DWL. The word line DWL may have a double word line structure including first and second word lines 222 and 223 facing each other with the horizontal layer 221 interposed therebetween. Referring to FIG. 3, the individual capacitor 230 may include a storage node 231, a dielectric layer 232, and a plate node 233. The plate nodes 233 of the capacitors 230 may be coupled to each other to form a shared plate node 234 also simply referred to as a common plate 234. The plate nodes 233 of the capacitor 230 may be part of the common plate 234.

The bit line 210 may have a pillar shape extending in a first direction D1. The horizontal layer 221 may have a bar shape extending in the second direction D2 that intersects with the first direction D1. The word line DWL may have a line shape extending in a third direction D3 that intersects with the first and second directions D1 and D2. The plate node 233 of the capacitor 230 may be coupled to the common plate 234.

The bit line 210 may be vertically oriented in the first direction D1. The bit line 210 is also referred to as a vertically oriented bit line or a pillar-type bit line. The bit line 210 may include a conductive material. The bit line 210 may include a silicon-based material, a metal or a metal-based material, or a combination thereof. The bit line 210 may include, for example, a metal, a metal nitride, a metal silicide, or a combination thereof. The bit line 210 may include, in some embodiments, polysilicon, titanium nitride, tungsten, or a combination thereof. For example, the bit line 210 may include, in some embodiments, polysilicon doped with an impurity such as an N-type impurity or titanium nitride (TiN). The bit line 210 may include a TiN/W stack including titanium nitride and tungsten on titanium nitride. A first contact plug 211 may be disposed below the bit line 210 for coupling the bit line 210 with the first lower pad 212. Hence, the first contact plug 211 may be coupled at one end thereof to the first lower pad 212 and an opposite end thereof to the bit line 210. The first lower pad 212 is also referred to as a bit line pad.

The word line DWL may extend in the third direction D3. The horizontal layer 221 may extend in the second direction D2. The horizontal layer 221 may be arranged horizontally in the second direction D2 from the bit line 210. The word line DWL may include a pair of word lines, for example, a first word line 222 and a second word line 223 facing each other in the first direction D1 with the horizontal layer 221 interposed therebetween. A gate dielectric layer 224 may be formed on the top and bottom surfaces of the horizontal layer 221.

The transistor 220 is a cell transistor and may have a word line DWL. In the word line DWL, the same voltage may be applied to the first word line 222 and the second word line 223. For example, the first word line 222 and the second word line 223 may form a pair, and the same word line driving voltage may be applied to the first word line 222 and the second word line 223. As described above, the memory cell MC according to the embodiment of the present invention may have a double word line structure, that is, a word line DWL in which two first and second word lines 222 and 223 are disposed adjacent to one horizontal layer 221.

According to another embodiment of the present invention, different voltages may be applied to the first word line 222 and the second word line 223. For example, a word line driving voltage may be applied to the first word line 222, and a ground voltage may be applied to the second word line 223. According to another embodiment of the present invention, the ground voltage may be applied to the first word line 222, and the word line driving voltage may be applied to the second word line 223. The first word line or the second word line 223 to which the ground voltage is applied are also referred to as a back word line or a shield word line.

The horizontal layer 221 may include a semiconductor material or an oxide semiconductor material. For example, the horizontal layer 221 may include monocrystalline silicon, germanium, silicon-germanium, or indium gallium zinc oxide (IGZO). The horizontal layer 221 may include, in some embodiments, polysilicon or monocrystalline silicon. As illustrated in FIG. 3, the horizontal layer 221 may include a channel 225, a first source/drain region 226 disposed between the channel 225 and the bit line 210, and a second source/drain region 227 disposed between the channel 225 and the capacitor 230. The channel 225 may be defined between the first source/drain region 226 and the second source/drain region 227.

The first source/drain region 226 and the second source/drain region 227 may be doped with impurities of the same conductivity type. The first source/drain region 226 and the second source/drain region 227 may be doped with an impurity, for example, an N-type impurity or a P-type impurity. In some embodiments, the first source/drain region 226 and the second source/drain region 227 may include at least one impurity selected among arsenic (As), phosphorus (P), boron (B), indium (In), and combinations thereof.

The horizontal layer 221 may have a smaller thickness than each of the first and second word lines 222 and 223. For example, the vertical thickness of the horizontal layer 221 in the first direction D1 may be smaller than the vertical thickness of each of the first and second word lines 222 and 223 in the first direction D1. The thin horizontal layer 221 is also referred to as a thin-body active layer. The horizontal layer 221 may include a thin-body channel 225 having a thickness of approximately 10 nm or less. According to another embodiment of the present invention, the channel 225 may have the same vertical thickness as those of the first and second word lines 222 and 223.

The gate dielectric layer 224 may include, for example, oxide, silicon nitride, a metal oxide, a metal oxynitride, a metal silicate, a high-k material, a ferroelectric material, an anti-ferroelectric material or a combination thereof. The gate dielectric layer 224 may include $SiO_2$, $Si_3N_4$, $HfO_2$, $Al_2O_3$, $ZrO_2$, AlON, HfON, HfSiO, HfSiON, or HfZrO.

The word line DWL may include a metal, a metal mixture, a metal alloy, or a semiconductor material. The word line DWL may include titanium nitride, tungsten, polysilicon, or a combination thereof. For example, the word line DWL may include a TiN/W stack in which titanium nitride and tungsten are sequentially stacked. The word line DWL may include an N-type work function material or a P-type work function material. The N-type work function material may have a low work function of approximately 4.5 eV or less, and the P-type work function material may have a high work function of approximately 4.5 eV or more.

The capacitor 230 may be disposed horizontally from the transistor TR in the second direction D2. The capacitor 230 may include a storage node 231 extending horizontally from the horizontal layer 221 in the second direction D2. The capacitor 230 may further include the dielectric layer 232 and the plate node 233 over the storage node 231. The storage node 231, the dielectric layer 232, and the plate node 233 may be arranged horizontally in the second direction D2. The storage node 231 may have a horizontally oriented cylinder shape. The dielectric layer 232 may conformally cover the cylindrical inner wall and the cylindrical outer wall of the storage node 231. The plate node 233 may have a shape extending to the cylindrical inner wall and the cylindrical outer wall of the storage node 231 over the dielectric layer 232. The plate nodes 233 of the capacitors 230 may be coupled in common to the common plate 234. The storage node 231 may be electrically connected to the second source/drain region 227.

The storage node 231 may have a three-dimensional structure, and the storage node 231 of the three-dimensional structure may have a horizontal three-dimensional structure which is oriented in the second direction D2. As an example of the three-dimensional structure, the storage node 231 may have a cylinder shape. According to another embodiment of the present invention, the storage node 231 may have a pillar shape or a pylinder shape. The pylinder shape may refer to a structure in which a pillar shape and a cylinder shape are merged.

The storage node 231 and the plate node 233 may include a metal, a noble metal, a metal nitride, a conductive metal oxide, a conductive noble metal oxide, a metal carbide, a metal silicide, or a combination thereof. For example, the storage node 231 and the plate node 233 may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The plate node 233 may include a combination of a metal or a metal-based material and a silicon-based material. For example, the plate node 233 may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the storage node 231 over the titanium nitride, and titanium nitride (TiN) may serve as the plate node 233 of the capacitor 230. Tungsten nitride may be a low-resistance material.

The dielectric layer 232 is also referred to as a capacitor dielectric layer. The dielectric layer 232 may include, for example, oxide, silicon nitride, a high-k material, or a combination thereof. The high-k material may have a higher dielectric constant than silicon oxide. Silicon oxide ($SiO_2$)

may have a dielectric constant of approximately 3.9, and the dielectric layer 232 may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer 232 may be formed of a composite layer including two or more layers of the aforementioned high-k materials.

The dielectric layer 232 may be formed of zirconium (Zr)-based oxide. The dielectric layer 232 may have a stack structure including at least zirconium oxide ($ZrO_2$). The dielectric layer 232 may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack are also referred to as a zirconium oxide ($ZrO_2$)-based layer. According to another embodiment of the present invention, the dielectric layer 232 may be formed of hafnium (Hf)-based oxide. The dielectric layer 232 may have a stack structure including at least hafnium oxide ($HfO_2$). The dielectric layer 232 may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack are also referred to as a hafnium oxide ($HfO_2$)-based layer. In the ZA stack, ZAZ stack, HA stack, and HAH stack, aluminum oxide ($Al_2O_3$) may have a greater bandgap energy (which will be, hereinafter, simply referred to as bandgap) than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer 232 may include a stack of a high-k material and a high-bandgap material having a greater bandgap than the high-k material. The dielectric layer 232 may include, for example, oxide ($SiO_2$) as a high bandgap material other than aluminum oxide ($Al_2O_3$). Since the dielectric layer 232 includes a high bandgap material, leakage current may be suppressed. The high-bandgap material may be thinner than the high-k material. According to another embodiment of the present invention, the dielectric layer 232 may include a laminated structure in which a high-k material and a high-bandgap material are alternately stacked. For example, it may include a ZAZA ($ZrO_2/Al_2O_3/ZrO_2/Al_2O_3$) stack, a ZAZA ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer 232 may include a stack structure, a laminated structure, or a mixed structure including zirconium oxide, hafnium oxide, and aluminum oxide.

According to another embodiment of the present invention, the dielectric layer 232 may include a ferroelectric material or an antiferroelectric material.

According to another embodiment of the present invention, an interface control layer for improving leakage current may be further formed between the storage node 231 and the dielectric layer 232. The interface control layer may include titanium oxide ($TiO_2$), niobium oxide, or niobium nitride. The interface control layer may also be formed between the plate node 233 and the dielectric layer 232.

The capacitor 230 may include a metal-insulator-metal (MIM) capacitor wherein the storage node 231 and the plate node 233 are made of a metal or a metal-based material.

The capacitor 230 may be replaced with another data storage material. For example, the data storage material may be a phase change material, a magnetic tunnel junction (MTJ), or a variable resistance material.

The memory cells MC may be arranged in the first to third directions D1, D2, and D3 to form a memory cell array MCA. The memory cell array MCA may include a three-dimensional array of the memory cells MC.

One bit line 210 may contact horizontal layers 221 that are disposed adjacent to each other in the first direction D1. The horizontal layers 221 that are disposed adjacent to each other in the third direction D3 may share one word line DWL. The capacitors 230 may be coupled to the horizontal layers 221, respectively. Each of the horizontal layers 221 may be thinner than the first and second word lines 222 and 223 of the word line DWL.

In the memory cell array MCA, a plurality of word lines DWL may be vertically stacked in the first direction D1. Each of the word lines DWL may include a pair of a first word line 222 and a second word line 223. Between the first word lines 222 and the second word lines 223, a plurality of horizontal layers 221 may be horizontally arranged to be spaced apart from each other in the third direction D3. A channel 225 of the horizontal layer 221 may be disposed between each pair of the first word lines 222 and the second word lines 223.

Referring to line B-B' of FIG. 1, each of the word lines DWL may have an edge portion WLE having a stepped shape. Each of the first word lines 222 and the second word lines 223 may include an edge portion WLE. Word line contact pads 241 may be disposed between the edge portions WLE of the first word lines 222 and the edge portions WLE of the second word lines 223.

The edge portions WLE of the word lines DWL may be respectively coupled to the second contact plugs 242. The second contact plugs 242 may be coupled to the second lower pad 243. The second lower pad 243 are also referred to as a 'word line pad'.

As described above, the memory cell array MCA may include a first lower pad 212, a second lower pad 243, and an upper pad 253. The first lower pad 212 and the second lower pad 243 may be disposed at the same horizontal level. The first lower pad 212 and the second lower pad 243 may be disposed at a higher level than the first and second bonding pads 310 and 320. The upper pad 253 may be disposed at a higher level than the first lower pad 212 and the second lower pad 243.

The peripheral circuit portion PERI may include a substrate 101, peripheral circuits 110A and 110B over the substrate 101, and a multi-level interconnection 120. The peripheral circuits 110A and 110B may include peripheral circuit transistors. The bit line 210 of the memory cell array MCA may be oriented vertically in the first direction D1 with respect to the top surface of the peripheral circuit portion PERI, and the word line DWL may be oriented parallel to the top surface of the peripheral circuit portion PERI in the third direction D3.

The peripheral circuit portion PERI may be disposed at a lower level than the memory cell array MCA. This are also referred to as a COP (Cell-Over-PERI) structure. The peripheral circuit portion PERI may include at least one control circuit for driving the memory cell array MCA. The at least one control circuit of the peripheral circuit portion PERI may include peripheral circuits 110A and 110B. The peripheral circuits 110A and 110B may include an N-channel transistor, a P-channel transistor, a CMOS circuit, or a combination thereof. The peripheral circuits 110A and 110B may include an address decoder circuit, a read circuit, a write circuit, and the like. The peripheral circuits 110A and 110B may include a planar channel transistor, a recess channel transistor, a buried gate transistor, a fin channel transistor (FinFET), and the like.

For example, the peripheral circuits 110A and 110B of the peripheral circuit portion PERI may include a sub-word line driver 110B and a sense amplifier 110A. The word line DWL may be coupled to the sub-word line driver 110B through the second contact plugs 242 and the second lower pad 243. The bit lines 210 may be coupled to the sense amplifier 110A through the first contact plug 211 and the first lower pad 212. The first lower pad 212 and the sense amplifier 110A may be coupled through the first and second bonding pads 310 and 320 and the multi-level interconnection 120. The second lower pad 243 and the sub-word line driver 110B may be coupled through the first and second bonding pads 310 and 320 and the multi-level interconnection 120. The multi-level interconnections 120 may have a multi-level metal structure of at least four layers including a plurality of vias and a plurality of metal lines.

A bonding structure WBD may be disposed between the peripheral circuit portion PERI and the memory cell array MCA. The bonding structure WBD may include first bonding pads 310 and second bonding pads 320. The memory cell array MCA and the peripheral circuit portion PERI may be coupled to each other through metal-to-metal bonding. The memory cell array MCA and the peripheral circuit portion PERI may be coupled to each other through hybrid bonding. For example, they may be coupled to each other through the first bonding pads 310 and the second bonding pads 320. The metal-to-metal bonding may refer to direct bonding between the first bonding pads 310 and the second bonding pads 320, and the hybrid bonding may refer to a combination of metal-to-metal bonding and dielectric bonding. The first and second bonding pads 310 and 320 may include a metal material. The dielectric bonding may include oxide-to-oxide bonding.

The plate node 233 of the capacitor 230 may be coupled to the third contact plug 252 and the upper pad 253. The third contact plug 252 may pass through an upper-level inter-layer dielectric layer 251, a dielectric body 272, and an upper-level etch stopper 271 to be coupled to the common plate 234 and the plate nodes 233. The upper pad 253 is also referred to as a plate pad.

The memory cell array MCA may further include a lower-level inter-layer dielectric layer 201, a lower-level etch stopper 202, and a hard mask layer 203. A bottom portion of the bit line 210 may pass through the hard mask layer 203 and the lower-level etch stopper 202, and the first contact plug 211 may be formed in the lower-level inter-layer dielectric layer 201. The second contact plug 242 may pass through the lower-level inter-layer dielectric layer 201, the lower-level etch stopper 202, and the hard mask layer 203.

The dielectric body 272, the hard mask layer 203, the lower-level inter-layer dielectric layer 201, and the upper-level inter-layer dielectric layer 251 may include, for example, oxide, silicon nitride, or a combination thereof. The lower-level etch stopper 202 and the upper-level etch stopper 271 may include, for example, a nitride. The dielectric body 272 may be formed by replacing a silicon substrate with silicon oxide.

According to another embodiment of the present invention, it may further include a peripheral circuit pad which is coupled to other constituent elements of the peripheral circuit portion PERI. The peripheral circuit pad may be disposed at the same horizontal level as that of the upper pad 253.

FIGS. 4 to 10 are diagrams illustrating a method for fabricating a semiconductor device in accordance with an embodiment of the present invention.

Figure 4:
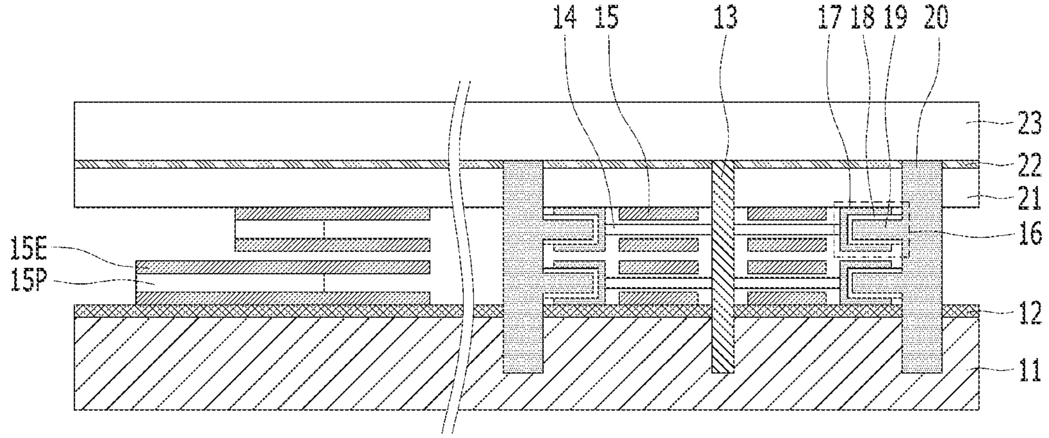
FIGS. 4 to 10 are diagrams illustrating a method for fabricating a semiconductor device in accordance with an embodiment of the present invention.

Referring to FIG. 4, a memory cell array MCA may be formed. A method of forming the memory cell array MCA is as follows.

First, a first etch stopper 12 may be formed over or directly on a first substrate 11. The first etch stopper 12 may include, for example, a nitride. The first substrate 11 may include a semiconductor substrate. The first substrate 11 may include a silicon substrate. The first substrate 11 may include a sacrificial material that may be removed in the subsequent process. The first substrate 11 is also referred to as a sacrificial substrate.

A memory cell array MCA may be formed over the first etch stopper 12. The memory cell array MCA may include the memory cell array MCA as illustrated in FIGS. 1 to 3. The memory cell array MCA may include a bit line 13, a horizontal layer 14, a double word line 15, and a capacitor 16. The capacitor 16 may include a storage node 17, a dielectric layer 18, and a plate node 19. The plate nodes 19 of the capacitors 16 may be coupled to a common plate 20. The double word line 15 may include a pair of word lines facing each other with the horizontal layer 14 interposed therebetween. A pair of word lines of each double word line 15 may include a word line edge portion 15E, individually, and word line contact pads 15P may be formed between the word line edge portions of a pair of word lines.

The bit line 13 and the common plate 20 may be coupled to the first substrate 11. The bit line 13 and the common plate 20 may pass through a hard mask layer 21 and a second etch stopper 22. The second etch stopper 22 may include, for example, a nitride. The hard mask layer 21 may include, for example, an oxide.

Figure 5:
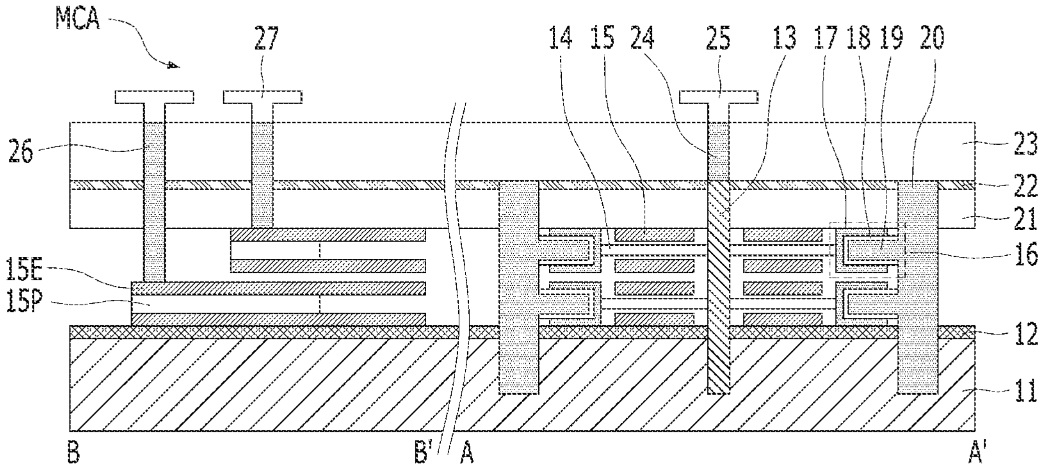

Referring to FIG. 5, an inter-layer dielectric layer 23 may be formed over the second etch stopper 22. The inter-layer dielectric layer 23 may include, for example, oxide.

A first contact plug 24 may be formed to pass through the inter-layer dielectric layer 23 and the second etch stopper 22 to be coupled to the bit line 13. A first lower pad 25 may be formed over the first contact plug 24.

Also, a second contact plug 26 and a second lower pad 27 may be formed to be respectively coupled to the word line edge portions 15E.

The first and second contact plugs 24 and 26 may include a metal or a metal-based material. For example, the first and second contact plugs 24 and 26 may include at least one of tungsten, titanium nitride, or a combination thereof. The first and second contact plugs 24 and 26 are also referred to as vias.

The first lower pad 25 and the second lower pad 27 may include a metal or a metal-based material. For example, the first lower pad 25 and the second lower pad 27 may include at least one of tungsten, titanium nitride, copper, aluminum, or a combination thereof.

Figure 6:
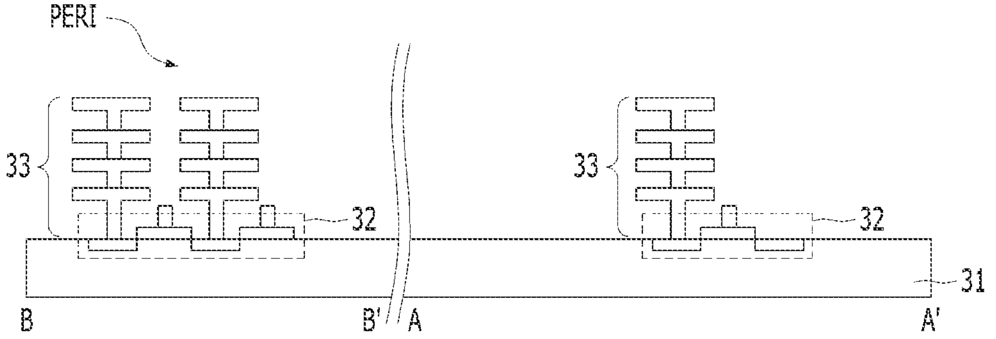

Referring to FIG. 6, a peripheral circuit portion PERI including a second substrate 31, peripheral circuits 32, and a multi-level interconnection 33 may be prepared. The second substrate 31 may include a semiconductor substrate. The second substrate 31 may include a silicon substrate. The peripheral circuits 32 may include at least one control circuit for driving the memory cell array MCA. The peripheral circuits 32 may include an N-channel transistor, a P-channel transistor, a CMOS circuit, or a combination thereof. The peripheral circuits 32 may include an address decoder circuit, a read circuit, a write circuit, and the like. The peripheral circuits 32 may include a planar channel transistor, a recess channel transistor, a buried gate transistor, a fin channel transistor (FinFET), and the like.

For example, the peripheral circuits 32 may include a sub-word line driver and a sense amplifier.

In some embodiments, the multi-level interconnection 33 may include at least four layers of interconnections. The multi-level interconnection 33 may be formed by a Damascene process. The multi-level interconnection 33 may have a multi-level metal layer structure including metal lines and metal vias.

Figure 7:
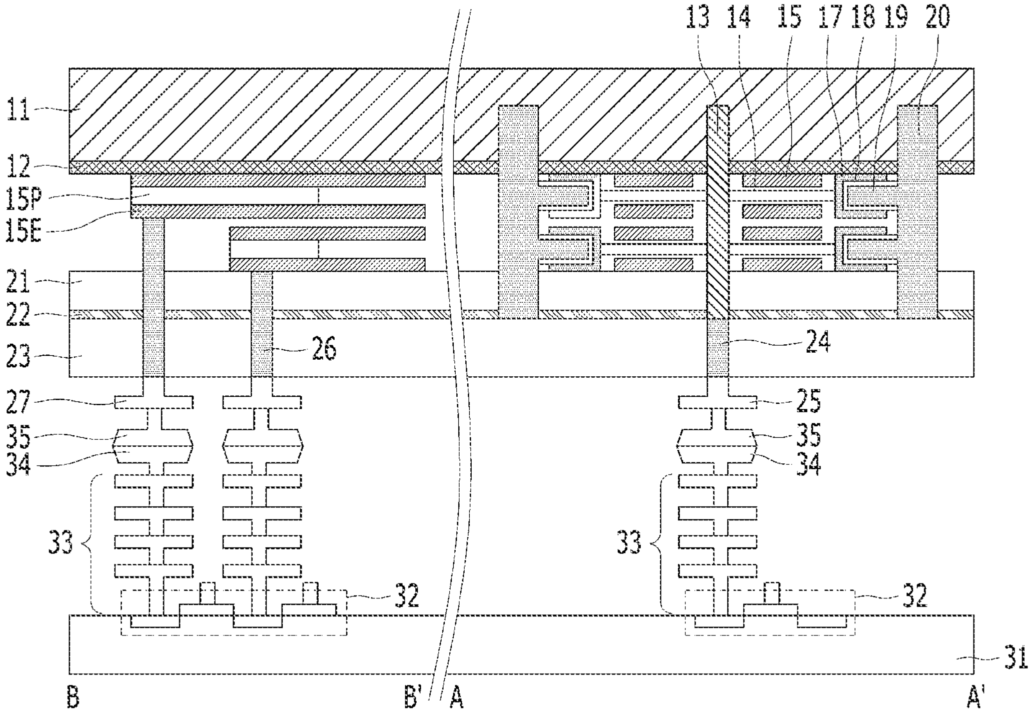

Referring to FIG. 7, the memory cell array MCA may be turned over to bond the first substrate 11 and the second substrate 31 to each other by a wafer bonding method. The first substrate 11 and the second substrate 31 may be bonded by metal-to-metal bonding. For example, they may be bonded to each other through the first bonding pads 34 and the second bonding pads 35. The first bonding pads 34 may be coupled to the multi-level interconnections 33. The second bonding pads 35 may be coupled to the first lower pad 25 and the second lower pad 27. The first bonding pads 34 and the second bonding pads 35 may include a metal or a metal-based material.

Since the memory cell array MCA is turned over to perform wafer bonding, the positions of the first substrate 11 and the memory cell array MCA may be changed. For example, the rear surface of the first substrate 11 may be disposed at the uppermost level, and the inter-layer dielectric layer 23 of the memory cell array MCA may be disposed at the lowermost level.

The inter-layer dielectric layer 23 may be simply referred to as a lower-level inter-layer dielectric layer, and the second etch stopper 22 may be simply referred to as a lower-level etch stopper. The first etch stopper 12 may be simply referred to as a high-level etch stopper.

Figure 8:
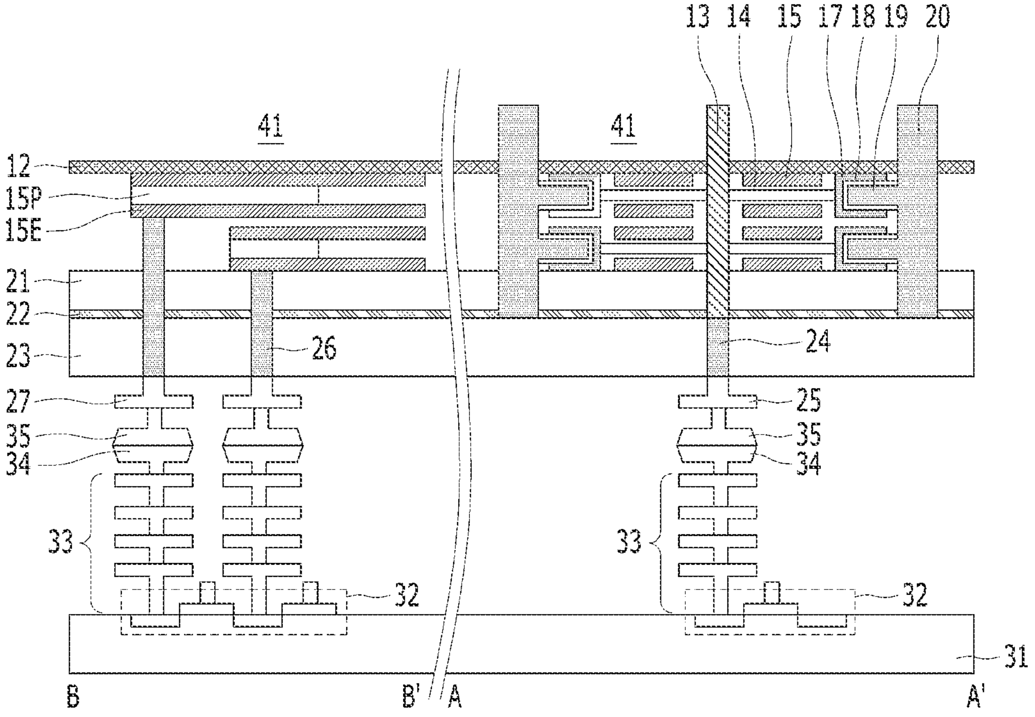

Referring to FIG. 8, the first substrate 11 may be stripped after back-grinding the rear surface of the first substrate 11. Accordingly, a rear recess 41 exposing portions of the bit line 13 and the common plate 20 may be formed.

Figure 9:
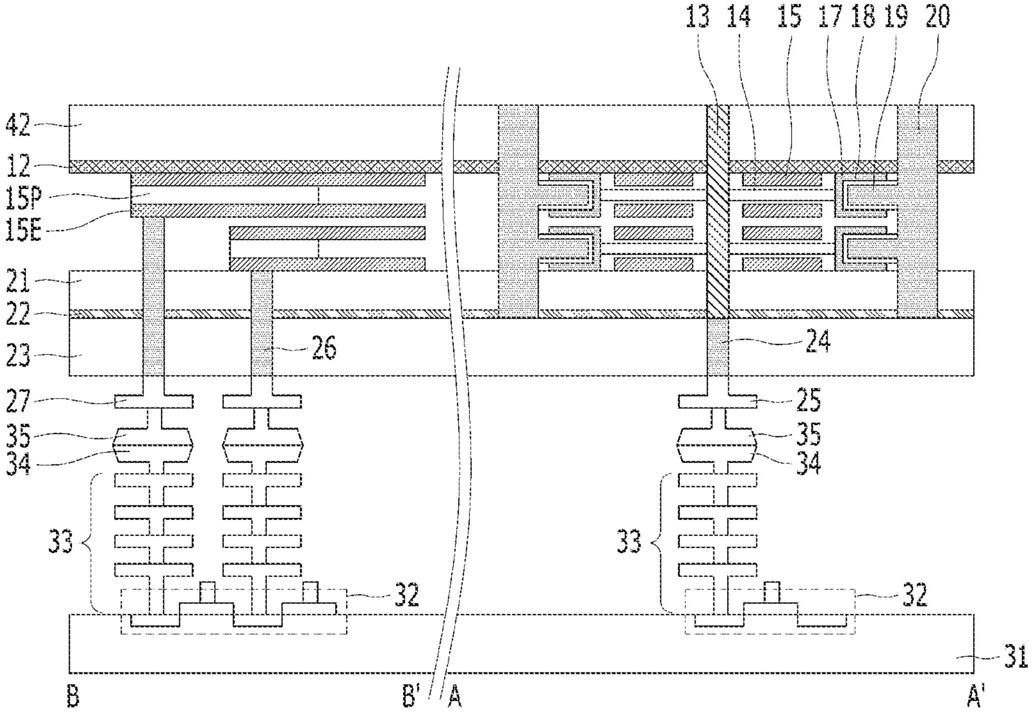

Referring to FIG. 9, a dielectric body 42 filling the rear recess 41 may be formed. The dielectric body 42 may include, for example, an oxide. The dielectric body 42 may be formed by depositing silicon oxide and then performing a planarization process. Some surfaces of the bit line 13 and the common plate 20 may be exposed by the dielectric body 42.

Figure 10:
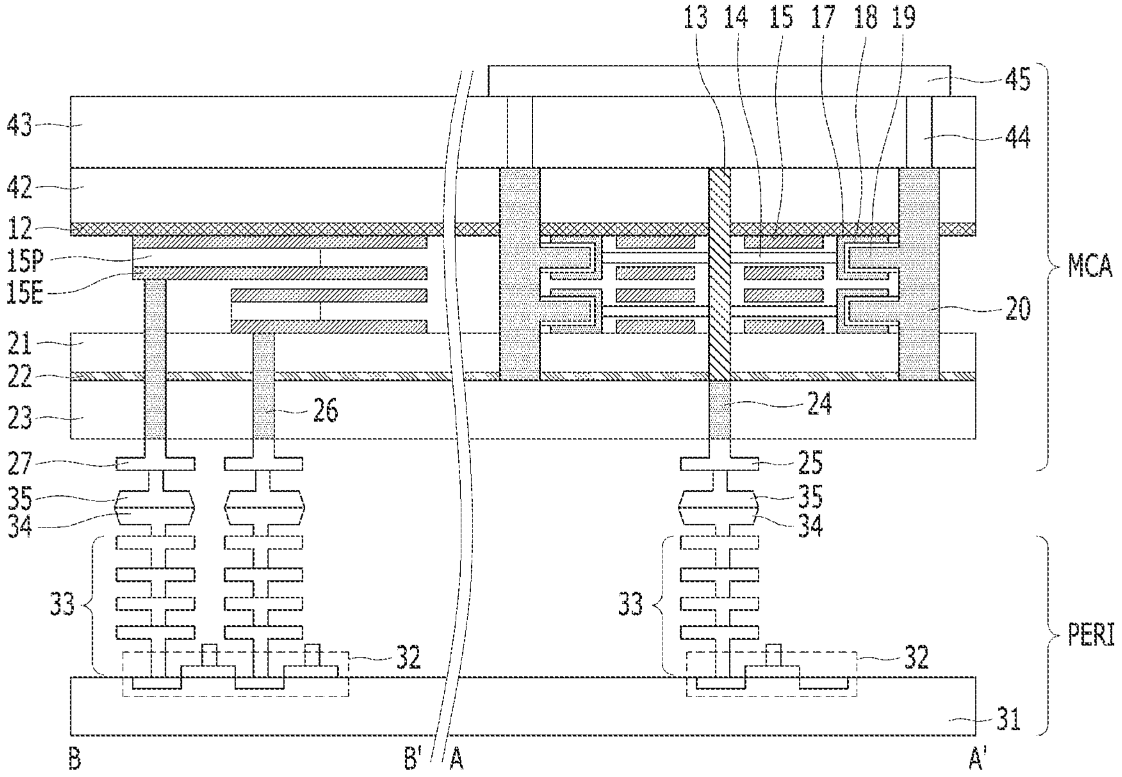

Referring to FIG. 10, after an upper-level inter-layer dielectric layer 43 is formed over the dielectric body 42, a third contact plug 44 penetrating the upper-level inter-layer dielectric layer 43 may be formed. The third contact plug 44 may be coupled to the common plate 20.

Subsequently, an upper pad 45 may be formed over and in contact with the third contact plug 44. The third contact plug 44 and the upper pad 45 may include a metal or a metal-based material.

Referring to FIG. 10, the first and second bonding pads 34 and 35 may be disposed at a lower level than the first lower pad 25 and the second lower pad 27. The upper pad 45 may be disposed at a higher level than the first lower pad 25 and the second lower pad 27. As described above, the upper pad 45 may be disposed at the uppermost level, and the first lower pad 25 and the second lower pad 27 may be disposed at the middle level, and the first and second bonding pads 34 and 35 may be disposed at the lowermost level.

Figure 11:
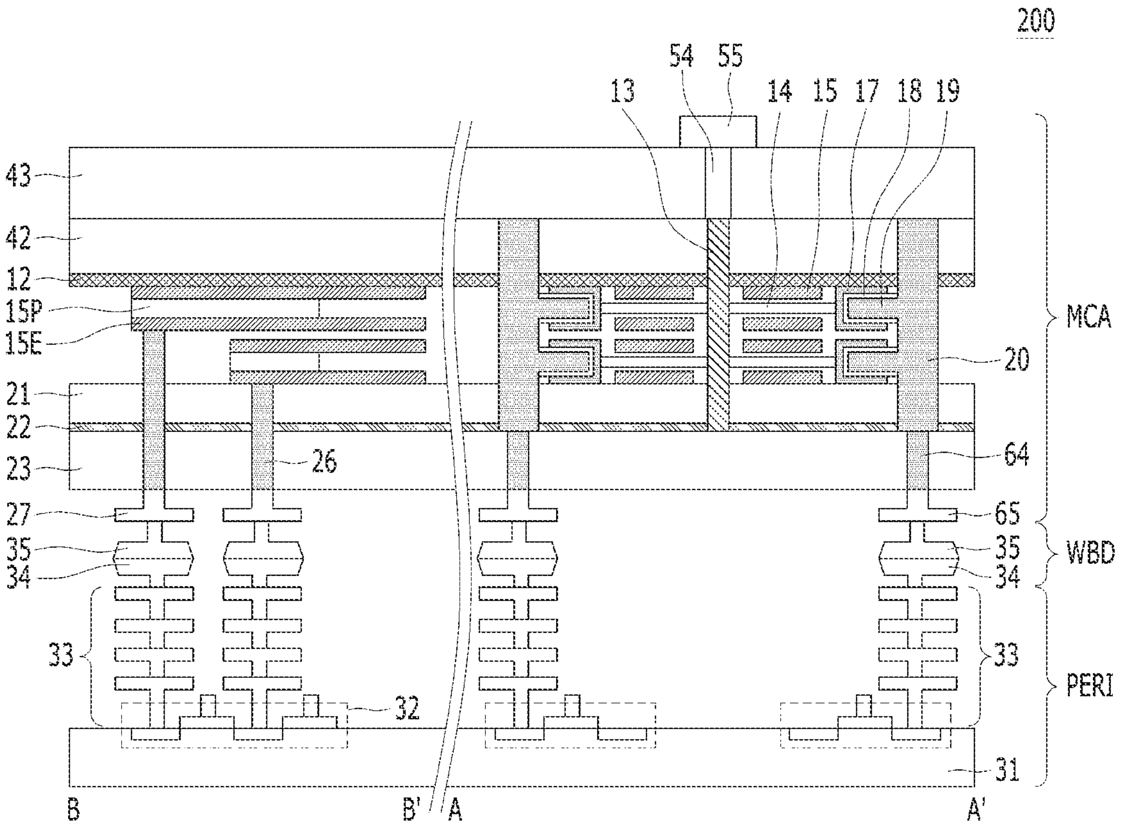
FIG. 11 is a simplified schematic cross-sectional view illustrating a semiconductor device in accordance with another embodiment of the present invention.

FIG. 11 is a simplified schematic cross-sectional view illustrating a semiconductor device 200 in accordance with another embodiment of the present invention. Hereinafter, the semiconductor device 200 of FIG. 11 may be similar to the semiconductor device 100 of FIG. 2 and FIG. 9. Hereinafter, detailed descriptions on the constituent elements which also appear in FIG. 2 and FIG. 9 may be omitted.

Referring to FIG. 11, the semiconductor device 200 may include a peripheral circuit portion PERI and a memory cell array MCA. The memory cell array MCA may be disposed over the peripheral circuit portion PERI. A bonding structure WBD may be disposed between the memory cell array MCA and the peripheral circuit portion PERI. The memory cell array MCA and the peripheral circuit portion PERI may be coupled to each other by the bonding structure WBD. The bonding structure WBD may include a first bonding pad 34 and a second bonding pad 35.

The memory cell array MCA may include a three-dimensional array of memory cells. The memory cell array MCA may have a mirror-type structure sharing the bit line 13. Each of the memory cells may include the bit lines 13, a transistor, and a capacitor. Each transistor may include a horizontal layer 14 and a double word line 15 having a double word line structure. Each capacitor may include a storage node 17, a dielectric layer 18 and a plate node 19. The plate nodes 19 of the capacitors may be coupled to a common plate 20.

The bit line 13 may be coupled to a third contact plug 54 and an upper pad 55. The common plate 20 may be coupled to a first contact plug 64 and a first lower pad 65. The first lower pad 65 may be coupled to the second bonding pad 35.

The double word line 15 may include an edge portion 15E, and the edge portion 15E of the double word line 15 may be coupled to the second lower pad 27 through the second contact plug 26. At the edge portion 15E of the double word line 15, a word line contact pad 15P may be formed between the double word lines 15.

The peripheral circuit portion PERI may include a semiconductor substrate 31, peripheral circuits 32, and a multi-level interconnection 33. The multi-level interconnection 33 may be coupled to the first bonding pad 34.

The memory cell array MCA and the peripheral circuit portion PERI may be wafer-bonded through the first bonding pad 34 and the second bonding pad 35.

Referring to FIGS. 4 to 10, since the memory cell array MCA and the peripheral circuit portion PERI are separately formed and combined by a wafer bonding method, the transistor characteristics of the memory cell array MCA may be improved.

Referring back to FIG. 11, the first and second bonding pads 34 and 35 may be disposed at a lower level than the first lower pad 65 and the second lower pad 27. The upper pad 55 may be disposed at a higher level than the first lower pad 65 and the second lower pad 27. The first lower pad 65 and the second lower pad 27 may be disposed at the same horizontal level.

The upper pad 55 may be coupled to the bit line 13 through the third contact plug 54, and the first lower pad 65 may be coupled to the capacitor through the common plate 20. The second lower pad 27 may be coupled to the double word line 15 through the second contact plug 26.

A method of fabricating the semiconductor device 200 shown in FIG. 11 may be similar to a series of the processes illustrated in FIGS. 4 to 10.

According to embodiments of the present invention, the memory cell array and the peripheral circuit portion are separately formed and combined by a wafer bonding method. This has been found to be advantageous for improving the transistor characteristics of the memory cell array.

While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:

a memory cell array including a vertical conductive line, a horizontal conductive line, and a data storage element;

a peripheral circuit portion disposed at a lower-level than the memory cell array;

a first bonding pad structure suitable for electrically connecting the vertical conductive line of the memory cell array and the peripheral circuit portion; and an upper pad disposed at a higher level than the memory cell array and coupled to the data storage element, wherein the upper pad directly contacts a contact plug, and the contact plug directly contacts a common plate of the data storage element.

2. The semiconductor device of claim 1, further comprising:

a first contact plug coupled to the vertical conductive line; and a first lower pad between the first contact plug and the first bonding pad structure.

3. The semiconductor device of claim 1, wherein the first bonding pad structure includes metal-to-metal bonding or hybrid bonding.

4. The semiconductor device of claim 1, further comprising:

a multi-layer interconnection between the peripheral circuit portion and the first bonding pad structure.

5. The semiconductor device of claim 1, wherein the vertical conductive line includes a bit line, the horizontal conductive line includes a word line, and the data storage element includes a capacitor.

6. The semiconductor device of claim 1, further comprising:

a second bonding pad structure disposed at a lower-level than the memory cell array and electrically connecting the horizontal conductive line and the peripheral circuit portion.

7. The semiconductor device of claim 6, further comprising:

a second contact plug coupled to an end of the horizontal conductive line; and a second lower pad between the second contact plug and the second bonding pad structure.

8. A semiconductor device, comprising:

a memory cell array including a vertical conductive line, a horizontal conductive line, and a data storage element;

a peripheral circuit portion disposed at a lower-level than the memory cell array;

a first bonding pad structure suitable for electrically connecting the data storage element of the memory cell array and the peripheral circuit portion; and an upper pad disposed at a higher level than the memory cell array and coupled to the vertical conductive line, wherein the upper pad directly contacts a contact plug, and the contact plug directly contacts the vertical conductive line.

9. The semiconductor device of claim 8, further comprising:

a first contact plug coupled to the data storage element; and a first lower pad between the first contact plug and the first bonding pad structure.

10. The semiconductor device of claim 8, wherein the first bonding pad structure includes metal-to-metal bonding or hybrid bonding.

11. The semiconductor device of claim 8, further comprising:

a multi-layer interconnection between the peripheral circuit portion and the first bonding pad structure.

12. The semiconductor device of claim 8, wherein the vertical conductive line includes a bit line, the horizontal conductive line includes a word line, and the data storage element includes a capacitor.

13. The semiconductor device of claim 8, further comprising:

a second bonding pad structure disposed at a lower-level than the memory cell array and electrically connecting the horizontal conductive line and the peripheral circuit portion.

14. The semiconductor device of claim 13, further comprising:

a second contact plug coupled to an end of the horizontal conductive line; and a second lower pad between the second contact plug and the second bonding pad structure.

* * * * *